United States Patent [19]
Yamauchi

[11] Patent Number: 5,467,354
[45] Date of Patent: Nov. 14, 1995

[54] TEST CONTROL CIRCUIT FOR CONTROLLING A SETTING AND RESETTING OF A FLIPFLOP

[75] Inventor: Hisashi Yamauchi, Tokyo, Japan

[73] Assignee: NEC Corporation, Tokyo, Japan

[21] Appl. No.: 126,653

[22] Filed: Sep. 27, 1993

[30] Foreign Application Priority Data

Sep. 25, 1992 [JP] Japan .................................. 4-256670

[51] Int. Cl.⁶ .......................... H04Q 9/00; G01R 31/28; G01R 31/00
[52] U.S. Cl. ...................... 371/22.3; 371/22.1; 371/22.6
[58] Field of Search .................... 371/22.1, 22.3, 371/22.5, 22.6

[56] References Cited

U.S. PATENT DOCUMENTS

| | | | |
|---|---|---|---|
| 4,580,137 | 4/1986 | Fiedler et al. | 371/22.3 X |
| 4,588,944 | 5/1986 | Rothenberger | 371/22.3 |
| 5,155,432 | 10/1992 | Mahoney | 371/22.3 X |
| 5,260,950 | 11/1993 | Simpson et al. | 371/22.1 X |

*Primary Examiner*—Emanuel T. Voeltz
*Assistant Examiner*—M. Kemper
*Attorney, Agent, or Firm*—Sughrue, Mion, Zinn, Macpeak & Seas

[57] ABSTRACT

In a scan path so configured that a series of tests using a scan path are performed by a scan shift of shifting the data of a scan path flipflop and a normal circuit test of testing a circuit for a normal operation by using the shifted data, and that at the time of the scan path testing, the scan path flipflop fetches data at a first timing and outputs the fetched data at a second timing, there is provided a scan path test control circuit which includes a control circuit so constructed to generate a logical value which never either sets or resets the scan path flipflop at the time of the scan shifting, and a logical value of validating a normal logic which sets or resets the scan path flipflop after the scan shifting. The test control circuit also generates, at the time of the normal test, a logic value which neither sets nor resets the scan path flipflop in synchronism with a timing signal between the first timing after the data is fetched and the second timing.

4 Claims, 5 Drawing Sheets

TEST CONTROL CIRCUIT FOR CONTROLLING A SETTING AND RESETTING OF A FLIPFLOP

BACKGROUND OF THE INVENTION

1. Field of the Invention

The present invention relates to a test control circuit for a scan path, and more particularly, to a circuit for controlling a setting and resetting of a flipflop.

2. Description of Related Art

Integrated circuits using a conventional scan path have been so constructed that, a set terminal and a reset terminal of flipflops are controlled to be forcibly maintained in a disable condition during a period in which a scan test is being performed, in order to protect a shift data applied to the set terminal and the reset terminal of flipflops in the process of the scan shifting.

For example, one conventional scan path is so constructed that, in the scan test, an input terminal for controlling a reset terminal of a scan path flipflop is fixed to a value, for example "1", which never sets or resets the flipflop regardless of whether it is either in a scan shifting or at the time of testing the normal circuit. This control makes it possible to avoid the shift data from being broken in the scan shifting. However, this construction cannot test the set and the reset of the flipflop. In the case that an internal circuit of an associated reset signal generating circuit is composed of only a combinational circuit, if the values are appropriately set, it cannot be said that it is not possible to test the set terminal and the reset terminal. However, if the reset signal generating circuit includes a sequential circuit, it is impossible to test the set terminal and the reset terminal.

In the control of the conventional scan path, accordingly, since the set terminal and the reset terminal of the scan flipflop are brought by a control signal into a disable condition in the process of testing the scan path, it is not possible to test, in the process of the scan path test, the set terminal and the reset terminal themselves of the scan path flipflop and a circuit for propagating the output to only the set terminal or the reset terminal of the scan path flipflop.

SUMMARY OF THE INVENTION

Accordingly, it is an object of the present invention to provide a scan path test control circuit which has overcome the above mentioned defect of the conventional one.

Another object of the present invention is to provide a scan path test control circuit which makes it possible to test the set terminal and the reset terminal of the scan path flipflop in the process of the scan path test.

The above and other objects of the present invention are achieved in accordance with the present invention by a scan path so configured that a series of tests using a scan path composed of a scan path flipflop are performed by a scan path shift of shifting the data of the scan path flipflop and a normal circuit test of testing a circuit for a normal operation by using the shifted data, and that at the time of the scan path testing, the scan path flipflop fetches data at a first timing and outputs the fetched data at a second timing. The scan path includes a test control circuit so constructed to generate a logical value which never either sets or resets the scan path flipflop at the time of the scan shifting, and a logical value of validating a normal logic which sets or resets the scan path flipflop after the scan shifting, the test control circuit also generating, at the time of the normal test, a logic value which neither sets nor resets the scan path flipflop in synchronism with a timing signal between the first timing after the data is fetched and the second timing.

The above and other objects, features and advantages of the present invention will be apparent from the following description of preferred embodiments of the invention with reference to the accompanying drawings.

DESCRIPTION OF THE PREFERRED EMBODIMENTS

Figure 1:
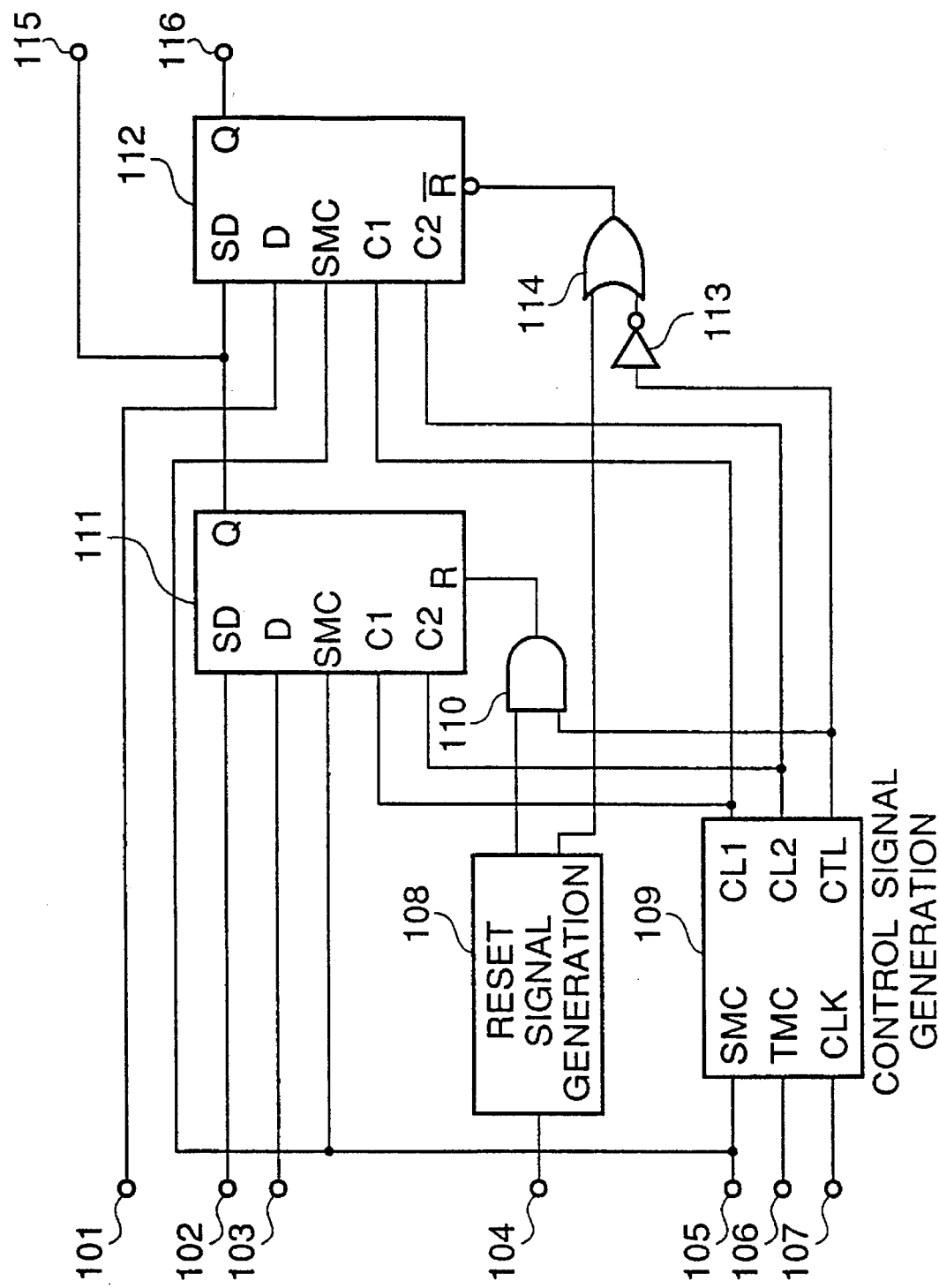
FIG. 1 is a circuit diagram of one embodiment of the scan path test control circuit in accordance with the present invention.

Referring to FIG. 1, there is shown a a circuit diagram of one embodiment of the scan path test control circuit in accordance with the present invention. In the following description, the "normal-circuit" should be understood to mean a circuit which performs an operation that should be inherently performed in an integrated circuit, and to correspond to a circuit excluding a circuit provided for the testing. In addition, the "normal operation" should be understood to indicate an operation which is performed with only the normal circuit without using the scan path.

In FIG. 1, Reference Numerals 101,102, 103, 104, 105, 106 and 107 designate an input terminal, and Reference Numeral 108 shows a circuit for generating a reset signal. Reference Numeral 109 indicates a control signal generating circuit, and Reference Numeral 110 shows an AND gate. Reference Numerals 111 and 112 designate a scan flipflop, and Reference Numeral 113 indicates an inverter. Reference Numeral 114 shows an OR gate, and Reference Numerals 115 and 116 designate an output terminal.

The input terminals 101 and 103 are a data input terminal to be connected to a normal circuit, and the input terminal 102 is connected to a scan output signal of a preceding stage in response to the scan input signal. The output terminal 116 is connected to a scan input signal of a succeeding stage in response to a scan output signal. In this shown embodiment, the output terminal 116 functions not only as the scan data output but also as the output supplied to the normal circuit. The output terminal 115 is an output of the scan flipflop 111 connected to the normal circuit. An input signal applied to the reset signal generating circuit 108 is supplied through the input terminal 104. This input signal may be composed of a plurality of signals dependently upon the construction of a normal logic.

The control signal generating circuit 109 receives control signal SMC and TMC and a clock signal CLK, and generates control signals CL1, CL2 and CTL. The control signal SMC is a mode signal indicating whether the scan path is realized in the form of a shift register for performing the data shifting, or the test for the normal circuit should be performed. The control signal TMS is a signal for resetting the control circuit 109. This control signal TMS can in some case be used also as the mode signal for indicating which of a series of tests using the scan path and the test for the normal circuit should be performed.

The timing signal CL1 is a clock signal indicating a timing of fetching the data in the scan operation of the scan flipflop, and the timing signal CL2 is a clock signal indicating a timing of outputting the data in the scan operation of the scan flipflop. The control signal CTL is a signal for controlling a setting signal and a resetting signal for the scan flipflop. In this shown embodiment, the control signal CTL is given a logical value of "1" for indicating an enable condition of the normal circuit, and a logical value of "0" for indicating a disable condition of the normal circuit.

The scan flipflops 111 and 112 are two flipflops having a polarity different to each other. Each of these flipflops 111 and 112 includes a scan data terminal SD, a data input terminal D for the normal circuit, a mode terminal SMC indicative of whether or not it is in the scan shift mode, a clock terminal C1 for a clock of the data fetching in the scan operation, a clock terminal C2 for a clock of the data outputting in the scan operation, a reset terminal R and a data output terminal Q. The reset terminal labelled with "R" means that the flipflop is reset when "1" is applied to the reset terminal, and the reset terminal labelled with "R̄" means that the flipflop is reset when "0" is applied to the reset terminal. The data terminal Q also acts as a scan dam output.

The reset terminal R of the scan flipflop 111 receives through the AND gate 110 the reset signal, and the reset terminal R̄ of the scan flipflop 112 receives through the inverter 113 and the OR gate 114 the reset signal. In addition, when the control signal CTL outputted from the control signal generating circuit 109 is at the logic value of "1", the reset terminal of the scan flipflops 111 and 112 are fixed to receive the output signal generated from the reset signal generating circuit 108. When the control signal CTL outputted from the control signal generating circuit 109 is at the logic value of "0", the reset terminal of the scan flipflops 111 and 112 are fixed not to receive the output signal from the reset signal generating circuit 108.

The control signal generating circuit 109 generates the two timing signals CL1 and CL2 on the basis of the clock signal CLK, and in addition, internally generates a third timing between the timing signal CL1 for indicating the data fetching and the timing signal CL2 for indicating the data outputting. When the control signal SMC is at a logical value indicating the scan shift mode, the control signal CTL is brought to "0", and when the control signal SMC is at a logical value indicating the normal circuit test mode, the control signal CTL is maintained at the logical value of "1" until the third timing, and brought into the logical value of "0" after the third timing.

Thus, in the scan test, a signal from the normal circuit is supplied to the set and reset terminals of the scan flipflop at the time of the normal circuit testing, and since the value of the signal does not change when the signal is fetched into the scan flipflop, no racing occurs. In addition, the set and the reset are disable until the result of the test for the normal circuit is outputted from the data output of the scan flipflop. Therefore, although the output of the scan flipflop is connected to the set terminal or the reset terminal of another scan flipflop, the value of the scan flipflop can never be broken at the data outputting time of the scan flipflop. Furthermore, since the setting and the resetting are disable at the time of the scan shifting, the data is never broken. Accordingly, the test for the set terminal and the reset terminal can be surely performed.

Figure 2:
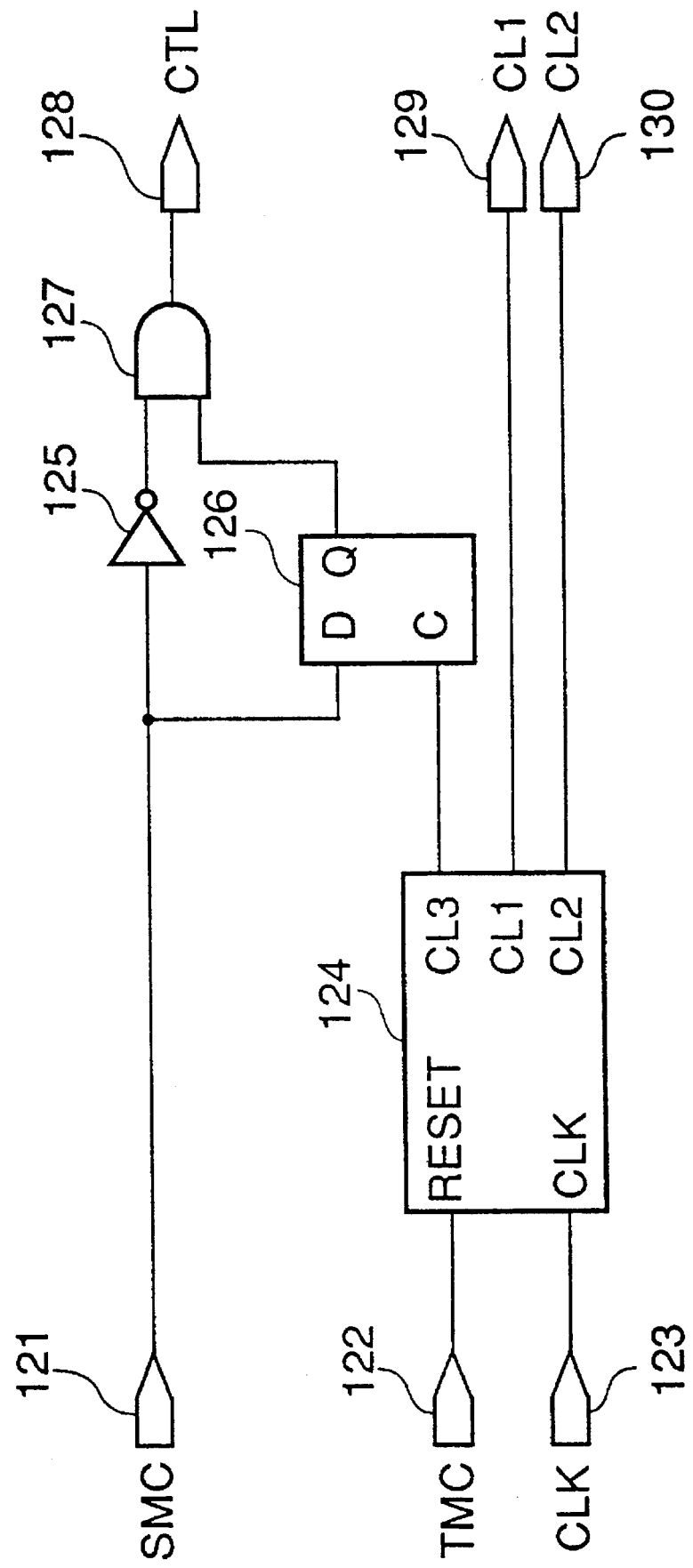
FIG. 2 is a circuit diagram of one embodiment of the control signal generating circuit used in the scan path test control circuit shown in FIG. 1.

Now, the construction of the control signal generating circuit 109 will be described with reference to FIG. 2. In FIG. 2, Reference Numerals 121,122 and 123 designate an input terminal, and Reference Numerals 128, 129 and 130 indicate an output terminal. Labels "SMC", "TMC", "CLK", "CTL", CL1"and "CL2" given to these terminals have the same meaning as those shown in FIG. 1, respectively. Reference Numeral 125 shows an inverter, and Reference Numeral 126 designates a D-type flipflop. Reference Numeral 127 indicates an AND gate, and Reference Numeral 124 shows a circuit for generating a timing signal for the flipflops contained in the circuit.

The timing signal generating circuit 124 receives the reset signal RESET and the clock signal CLK, and generates the timing signals CL1, CL2 and CL3. The timing signal CL1 is indicative of the timing of the data fetching of the scan flipflop, and the timing signal CL2 indicates the timing of the data outputting of the scan flipflop. The timing signal CL3 defines the third timing between the data fetching timing of the scan flipflop and the data outputting timing of the scan flipflop. In the shown embodiment, the timing where the timing signal CL3 changes from the logic level "0" to the logic level "1" defines the third timing.

The D-type flipflop 126 includes a data input terminal D, a clock input terminal C and a data output terminal Q. In the shown embodiment, the logic value "0" of the control signal SMC indicates the test for the normal circuit, and the logic value "1" of the control signal SMC indicates the scan shifting. The logic value "0" of the control signal TMC indicates the resetting of the timing signal generating circuit 124, and the logic value "1" of the control signal TMC shows the release of the reset of the timing signal generating circuit 124. The control signal CTL assumes the logic value "1" for indicating the enable of the set and the reset of the flipflop, and the logic value "0" for indicating the disable of the set and the reset of the flipflop.

When the control signal SMC is at "1", the control signal CTL becomes "0". When the control signal SMC is at "0", the control signal CTL becomes "1" if the output of the D-type flipflop 126 is "1", and the control signal CTL becomes "0" if the output of the D-type flipflop 126 is "0". When the Control signal SMC is maintained at "1" over a period of one cycle or more and thereafter is brought to "0", the output of the D-type flipflop 126 is maintained at "1" until the third timing, and brought into "0" after the third timing. Accordingly, at the time of the scan shifting, the control signal CTL is "0", but at the time of the normal circuit testing, the control signal CTL is "1" until third timing. Accordingly, if this circuit is incorporated in the circuit shown in FIG. 1, it is possible to perform the test of the set and the reset without destroying the shift data in the scan shifting.

Figure 3:
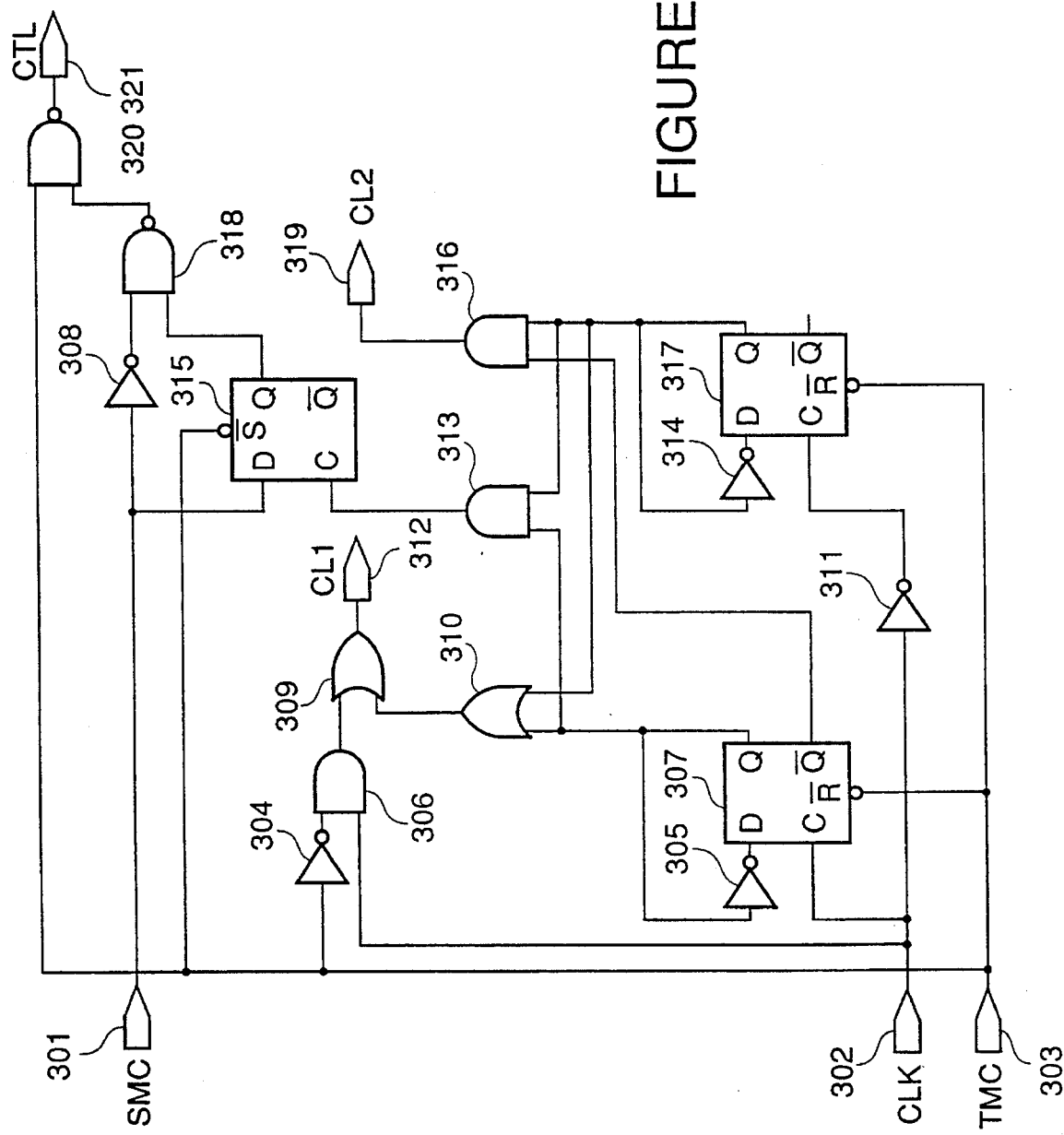
Figure 3 circuit diagram of another embodiment of the control sisal generating circuit used in the scan path test control circuit of the present invention.

Next, another embodiment of the control signal generating circuit 109 shown in FIG. 1 is illustrated in FIG. 3. In FIG. 3, Reference Numerals 301,302 and 303 designate an input terminal, and Reference Numerals 304, 305, 308, 311 and 314 show an inverter. Reference Numerals 306, 313 and 316 indicate an AND gate. Reference Numerals 309 and 310 designate an OR gate, and Reference Numerals 318 and 320 indicate a NAND gate. Reference. Numerals 307, 3 15 and 317 show a D-type flipflop, and Reference Numerals 312, 319 and 321 designate an output terminal.

A control signal SMC is a mode signal indicating whether the scan path is realized in the form of a shift register for performing the data shifting, or the test for the normal circuit should be performed. The control signal TMC is a signal for resetting the control signal generating circuit. In this embodiment, this signal is furthermore used as the mode signal for indicating which of a series of tests using the scan path and the normal operation should be performed. A control signal CTL enables the setting and the resetting for the scan flipflop when it is "1", and disables the setting and the resetting when it is "0". A timing signal CL1 is a clock signal indicating a timing of fetching the data into the scan flipflop, and the timing signal CL2 is a clock signal indicating a timing of outputting the data from the scan flipflop. In this shown embodiment, the timing signal is also used as a clock used when the circuit is in a condition other then the scan testing of the scan flipflop. Transition of "0" to "1" in an output of the AND gate 313 defines a third timing, namely, a timing between the data fetching timing of the scan flipflop and the data outputting timing of the scan flipflop.

Each of these flipflops 307, 315 and 317 includes a data input terminal D, a clock input terminal C, a reset input terminal R, a set input terminal S and a data output terminal Q. The reset terminal labelled with "R̄" means that the flipflop is reset when "0" is applied to the reset terminal, and the set terminal labelled with"S̄" means that the flipflop is set when "0" is applied it the set terminal "Q̄" indicates an inverted signal of the data outputted from the data terminal Q.

The inverter 305, the D-type flipflop 307, the OR gate 310, the inverter 311, the ANDr gate 313, the inverter 314, the inverter 316, and the D-type flipflop 317 constitute a circuit for generating three timing signals. When the control signal TMS is at "0", it indicates the normal operation mode using no scan path, and when the control signal TMS is at "1", it indicates the test mode using the scan path. When the control signal TMS is at "0", file Q output of the D-type flipflops 307 and 317 are brought to "0", the change of the clock on the clock terminal CLK is outputted from the terminal 312 for outputting the timing signal CL1. In addition, when the control signal TMS is at "0", the output of the NAND gate 320 is brought to "1", and therefore, the set and the reset of the flipflop become the normal operation. When the control signal TMS is at "1", a circuit, which is composed of the inverter 308, the NAND gate 313, the NAND gate 320, and the D-type flipflop 315 in synchronism with the output of the AND gate 313, generates the control signal CTL which has the logical value "1" indicative of the normal operation, until the third timing from the moment the control signal SMC changes from "1" to "0", and which has the logical value "0" indicating the disable of the set and the reset of the flipflop, during a period other than the above mentioned period.

In this embodiment, when the scan test is not performed, the scan flipflop operates with only the timing signal CL1. If the timing signal CL2 having the same waveform as that of the timing signal CL1 is used, it is sufficient if a circuit similar to the circuit which is composed of the inverter 304, the AND gate 306 and the OR gate 309 and which receives the clock signal CLK and the control signal TMS, is inserted between the AND gate 316 and the terminal 319 for outputting the timing signal CL2. In the case that the operation of the scan flipflop is the same in the scan testing and in the normal operation, or the clock is switched over at an external of the circuit or by the flipflop itself, the circuit composed of the inverter 304, the AND gate 306 and the OR gate 309 is unnecessary.

Figure 4:
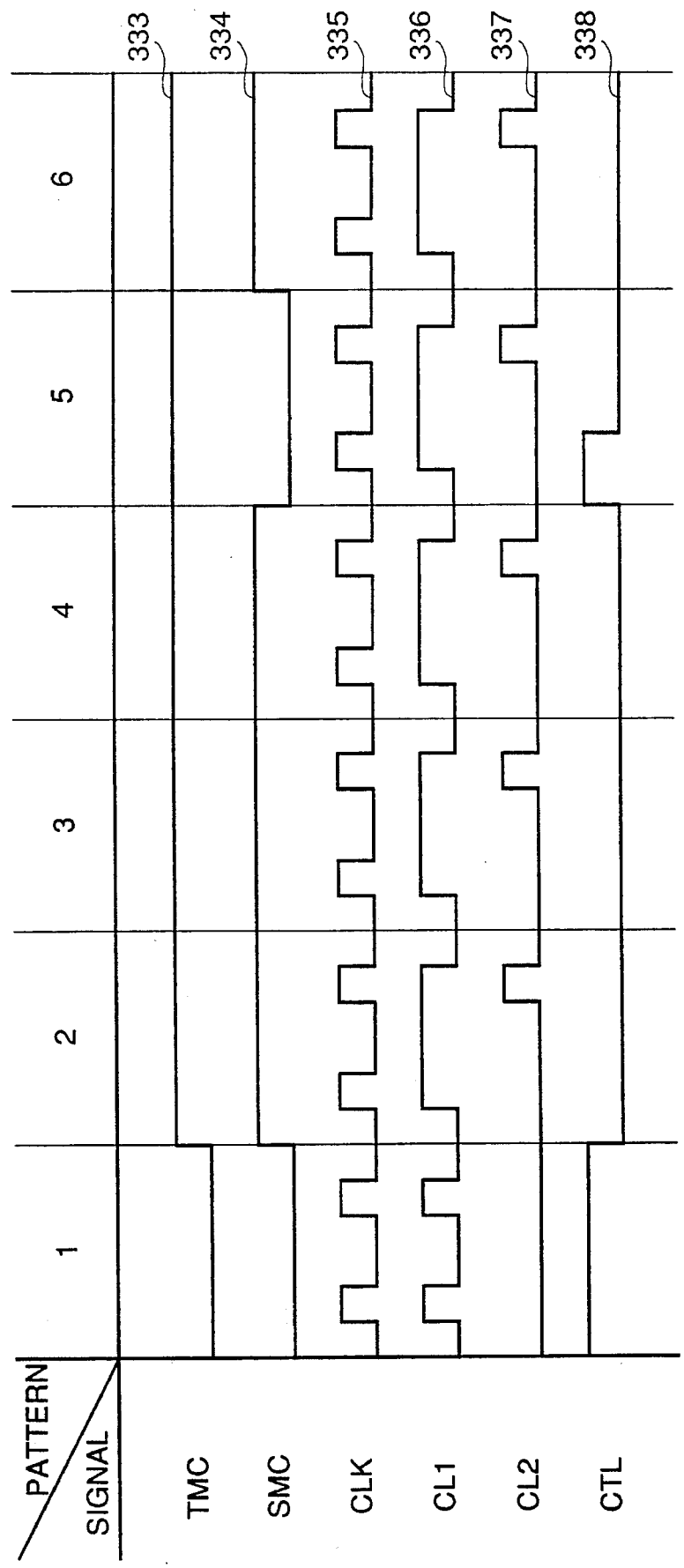
Figure 4 is a timing chart illustrating the operation of the second embodiment of the control signal generating circuit shown in FIG. 3.

FIG. 4 is a timing chart illustrating the operation of the circuit FIG. 3. In FIG. 4, Reference Numerals 333, 334, 335, 336, 337 and 338 indicate the waveform of the control signal TMS, the control signal SMC, the clock signal CLK, the timing signal CL1, the timing signal CL2 and the control signal CTL, respectively.

In a first pattern, the control signal TMC is "0". This shows that the circuit is in the normal operation, and the clock generating circuit is simultaneously reset. In this case, the control signal CTL is at the logical value of "1" indicative of the nominal operation in connection with the set and the reset of the flipflop. In a second pattern to a fourth pattern, the control signal SMC is "1". This means the scan shift operation, during which the control signal CTL is "0", and the set and reset of the flipflop are disabled. In a fifth pattern, the control signal SMC is "0", which indicates the test of the normal circuit. In this pattern, when the control signal changes from "1" to "0", the output Q of the flipflop 315 shown in FIG. 3 become "1" since the value of the control signal SMC fetched before one pattern is "1". Since the value of the control signal SMC is fetched and outputted n the form of "0" when the clock signal CLK changes from "1" to "0" for the first place, the output Q of the flipflop 315 becomes "0" at that time. Accordingly, the control signal CTL is "1" so as to enable the set and the reset of the flipflop during a period from the start of the fifth pattern to the moment the clock signal CLK changes from "1" to "0" for the first place. During the remaining period, the control signal CTL is "0" so as to disable the set and the reset of the flipflop.

Figure 5:
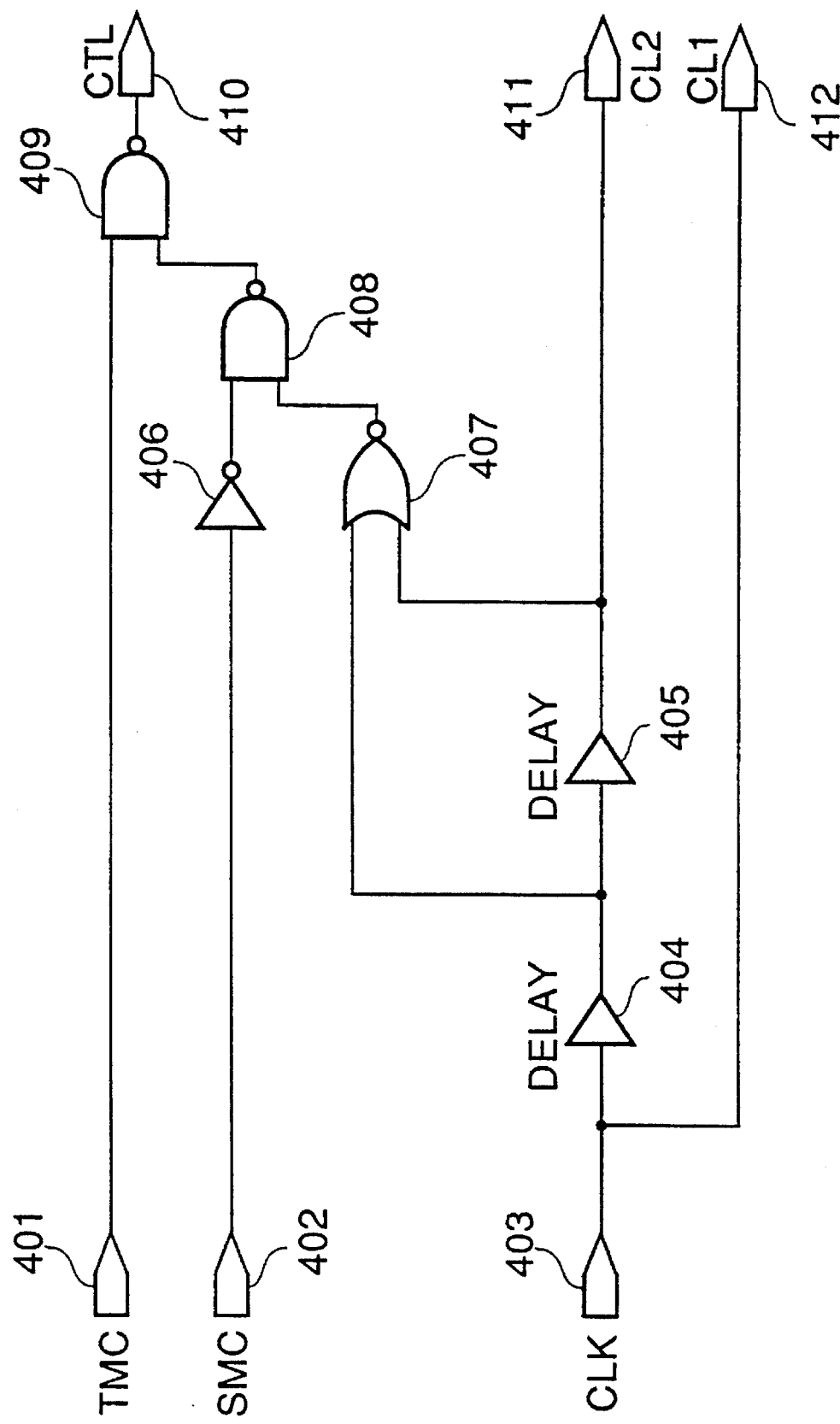
FIG. 5 is a circuit diagram of still another embodiment of the control signal generating circuit used in the scan path test control circuit circuit of the present invention.

Now, a further embodiment of the control signal generating circuit 109 shown in FIG. 1 will be described with reference to FIG. 5. In this embodiment, the flipflops are not used, and delay elements having a large delay time are used. In FIG. 5, Reference Numerals 401, 402 and 403 indicate an input terminal, and Reference Numerals 404 and 405 show a delay gate. Reference Numeral 406 indicates an inverter, and Reference Numeral 407 designates a NOR gate. Reference Numerals 408 and 409 show a NAND gate, and Reference Numerals 410, 411 and 412 indicate an output terminal.

The delay gates 404 and 405 has a delay time sufficient to create the timing for the scan testing. The timing an output of the delay gate 404 changes from "0" to "1" defines a timing between the data fetching timing of the scan flipflop and the data outputting timing of the scan flipflop, namely, the third timing. The control signal TMC indicates the normal operation mode using no scan path, when it is at "0", and the test mode in the scan mode when it is at "1". The control signal SMC designates the scan shift mode when it is at "0" and the test mode for the normal circuit when it is at "1". The control signal CTL indicates the disable of the set and the reset of the flipflop when it is at "0" and the enable of the set and the reset of the flipflop when it is at "1". In addition, in each pattern, after the timing signal CL2 changes form "0" to "1", the timing signal CL2 is maintained at "1" until the end of each pattern, and thereafter, the timing signal CL2 changes to "0". The waveform of the clock has a length period of "1" sufficient to have a period in which the output of the delay gate 404 is "1" and also the output of the delay gate 405 is "1".

In the embodiment shown in FIG. 3, a period of two clocks has been required to shift one item of data over one flipflop in the scan operation, however, in this embodiment, a period of only one clock is sufficient. In this embodiment, furthermore, the clock in the normal operation of the scan flipflop is generated similarly to the scan testing, or at an external of the circuit.

When the control signal TMC is "0", the output terminal 410 is brought to "1", and therefore, the set and the reset of the flipflop is enabled in the normal operation. When the control signal TMC is "1" and the control signal SMC is "1", the control signal CTL is "0", namely, the set and the reset of the flipflop is disabled in the shifting operation. If the control signal SMC is "0", the control signal CTL is "1" when the output of the NOR gate 407 is "0". The output "0" of the NOR gate 407 occurs when either the output of the delay gate 404 or the output of the delay gate 405 is "1". Since it is assumed that after the output of the delay gate 405 changes from "0" to "1", the output of the delay gate 405 remains at "1" until the end of each pattern, and also, since it is assumed that the output of the delay gate 405 changes from "0" to "1" during a period in which the output of the delay gate 404 is maintained at "1", the output of the NOR gate 407 becomes "0" in that pattern after the output of the delay gate changes form "0" to "1". Therefore, the control signal CTL is "1" after the control signal SMC is brought to "0" until the output of the delay gate 404 changes from "0" to "1", and thereafter, the control signal CTL becomes "0". Namely, when the control signal SMC becomes "0", the set and the reset of the flipflop is enabled only during a period from the start of that pattern to the third timing.

As mentioned above, the control circuit in accordance with the present invention is so constructed that the set and the reset of the flipflop is enabled at the time of the normal circuit testing in the scan path test, so that the set and the reset themselves of the flipflop and the circuit for the normal operation connected to the set and the reset of the flipflop can be tested. At the time of the test completion, the set and the reset of the flipflop are disabled at a timing independently of the data fetching timing and the data outputting timing of the flipflop, so that the setting and the resetting of the flipflop are inhibited in the scan shifting. Thus, it becomes possible to test the set and the reset themselves of the flipflop and the circuit for the normal operation connected to the set and the reset of the flipflop, which could not have been performed in the scan path test. At the same time, it is possible to surely shift the data in the scan shifting.

The invention has thus been shown and described with reference to the specific embodiments. However, it should be noted that the present invention is in no way limited to the details of the illustrated structures but changes and modifications may be made within the scope of the appended claims.

I claim:

1. A scan path test control circuit including:

first and second scan path flipflops each having a scan data terminal receiving a scan data signal for a scan path testing, a data input terminal receiving an input data signal for a normal circuit operation, a scan mode terminal receiving a scan mode signal indicative of whether the scan path circuit is in a scan shift mode or in a normal circuit test mode, a first clock terminal receiving a first clock for a data fetching, a second clock terminal receiving a second clock for a data outputting, a reset terminal and a data output terminal, said data output terminal of said first scan path flipflop being connected to said scan data terminal of said second scan path flipflop;

a first logic gate means having a first input connected to receive a reset signal, a second input, and an output connected to said reset terminal of said first scan path flipflop;

a second logic gate means having a first input connected to receive a reset signal, a second input, and an output connected to said reset terminal of said second scan path flipflop; and a control signal generating circuit receiving said scan mode signal, a basic clock signal and a control signal indicative of inhibition and permission of the resetting of said first and second scan path flipflops, for generating said first clock signal and said second clock signal supplied to said first and second scan path flipflops, said second clock signal being activated at a timing later than that of said first clock signal, so that during said scan path testing, each of said first and second scan path flipflops fetches the scan data signal on said scan data terminal thereof in response to said first clock signal, and outputs the fetched scan data signal in response to said second clock signal, said control signal generating circuit also generating a reset control signal supplied to said second input of each of said first and second logic gate means, said reset control signal being generated in such a manner that when said control signal is indicative of inhibition of the resetting of said first and second scan path flipflops, if said scan mode signal becomes indicative of the normal circuit test mode, said reset control signal first assumes an active level to open said first and second logic gate means so as to allow passage of said reset signal to said reset terminal of each of said first and second scan path flipflops, and then, assumes an inactive level at a timing between said first clock signal and said second clock signal so that the passage of said reset signal to said reset terminal of each of said first and second scan path flipflops is inhibited, whereby the data held on each of said first and second scan flipflops as the result of the passage of said reset signal to said reset terminal of each of said first and second scan path flipflops is maintained.

2. A scan path test control circuit claimed in claim 1 wherein said control signal generating circuit includes:

a timing signal generating circuit receiving said control signal and said basic clock signal, for generating said first clock signal, said second clock signal, and a third clock signal, which defines a third timing between said first clock signal and said second clock signal;

a D-type flipflop having a data input terminal receiving said scan mode signal, a clock input terminal receiving said third clock signal, and a data output terminal; and an AND gate having a first input connected to receive said scan mode signal through an inverter and a second input connected to said data output terminal of said D-type flipflop, an output of said AND gate generating said reset control signal, whereby when said control signal is indicative of inhibition of the resetting of said first and second scan path flipflops, if said scan mode signal becomes indicative of the normal circuit test mode after said scan mode signal had been indicative of the scan shift mode over a period of one cycle or more, said reset control signal first assumes said active level to open said first and second logic gate means so as to allow passage of said reset signal to said reset terminal of each of said first and second scan path flipflops, and then, assumes said inactive level at a timing of said third clock signal.

3. A scan path test control circuit claimed in claim 1 wherein said control signal generating circuit includes:

a first D-type flipflop having a clock input connected to receive said basic clock signal, an inverting reset terminal connected to receive said control signal, a non-inverting output terminal, an inverting output terminal, and a data input terminal connected through a first inverter to said non-inverting output terminal thereof;

a second D-type flipflop having a clock input connected to receive said basic clock signal through a second inverter, an inverting reset terminal connected to receive said control signal, a non-inverting output terminal, and a data input terminal connected through a third inverter to said non-inverting output terminal thereof;

a first OR gate having a first input connected to said non-inverting output terminal of said first D-type flipflop and a second input connected to said non-inverting output terminal of said second D-type flipflop;

a first AND gate having a first input connected to said inverting output terminal of said first D-type flipflop and a second input connected to said non-inverting output terminal of said second D-type flipflop, an output of said first AND gate generating said second clock signal;

a second AND gate having a first input connected to receive said control signal through a fourth inverter and a second input connected to receive said basic clock signal;

a second OR gate having a first input connected to an output of said first OR gate and a second input connected to an output of said second AND gate, an output of said second OR gate generating said first clock signal;

a third AND gate having a first input connected to said non-inverting output terminal of said first D-type flipflop and a second input connected to said non-inverting output terminal of said second D-type flipflop;

a third D-type flipflop having a clock input connected to an output of said third AND gate, an inverting set terminal connected to receive said control signal, a non-inverting output terminal, and a data input terminal connected to receive said scan mode signal;

a first NAND gate having a first input connected to receive said scan mode signal through a fifth inverter and a second input connected to said non-inverting output terminal of said third D-type flipflop; and a second NAND gate having a first input connected to receive said control signal and a second input connected to an output of said first NAND gate, an output of said second NAND gate generating said reset control signal, whereby when said control signal is indicative of inhibition of the resetting of said first and second scan path flipflops, if said scan mode signal becomes indicative of the normal circuit test mode after said scan mode signal had been indicative of the scan shift mode over a period of one cycle or more, said reset control signal first assumes said active level to open said first and second logic gate means so as to allow passage of said reset signal to said reset terminal of reach of said first and second scan path flipflops, and then, assumes said inactive level at a timing of said third clock signal.

4. A scan path test control circuit claimed in claim 1 wherein said control signal generating circuit includes:

first and second delay gates cascaded in such a manner that an output of said first delay gate is connected to an input of said second delay gate, said first delay gate having an input receiving said basic clock signal, and an output of said second delay gate generating said second clock signal, said basic clock signal being outputted without modification as said first clock signal;

a NOR gate having a first input connected to said output of said first delay gate and a second input connected to said output of said second delay gate;

a first NAND gate having a first input connected to receive said scan mode signal through an inverter and a second input connected to an output of said NOR gate; and a second NAND gate having a first input connected to receive said control signal and a second input connected to an output of said first NAND gate, an output of second NAND gate generating said reset control signal, said first and second delay gates having such a sufficient delay time that, when said control signal is indicative of inhibition of the resetting of said first and second scan path flipflops, if said scan mode signal becomes indicative of the normal circuit test mode after said scan mode signal had been indicative of the scan shift mode over a period of one cycle or more, said reset control signal first assumes said active level to open said first and second logic gate means so as to allow passage of said reset signal to said reset terminal of each of said first and second scan path flipflops, and then, assumes said inactive level at a timing of said third clock signal.

* * * * *

UNITED STATES PATENT AND TRADEMARK OFFICE
CERTIFICATE OF CORRECTION

PATENT NO.   : 5,467,354
DATED        : November 14, 1995
INVENTOR(S)  : Hisashi YAMAUCHI It is certified that error(s) appears in the above-identified patent and that said Letters Patent is hereby corrected as shown below:

Col. 2, line 18, delete "sisal", insert --signal--.

Col. 3, line 30, delete "dam", insert --data--.

Col. 4, line 11, delete "CL1"", insert --"CL1"--.

Col. 4, line 66, delete "3 15", insert --315--.

Col. 5, line 33, delete "ANDr", insert --AND--.

Signed and Sealed this

Eleventh Day of June, 1996

Attest:

BRUCE LEHMAN

Attesting Officer          Commissioner of Patents and Trademarks